United States Patent
Sharma et al.

(10) Patent No.: US 7,155,318 B2
(45) Date of Patent: Dec. 26, 2006

(54) AIR CONDITIONING UNIT CONTROL TO REDUCE MOISTURE VARYING OPERATIONS

(75) Inventors: Ratnesh K. Sharma, Union City, CA (US); Cullen E. Bash, San Francisco, CA (US); Chandrakant D. Patel, Fremont, CA (US)

(73) Assignee: Hewlett-Packard Development Company, LP., Houston, TX (US)

( * ) Notice: Subject to any disclaimer, the term of this patent is extended or adjusted under 35 U.S.C. 154(b) by 0 days.

(21) Appl. No.: 10/981,487

(22) Filed: Nov. 5, 2004

(65) Prior Publication Data

US 2006/0100744 A1    May 11, 2006

(51) Int. Cl.
- *G01M 1/38* (2006.01)
- *G05B 13/00* (2006.01)
- *G05B 15/00* (2006.01)
- *G05B 21/00* (2006.01)
- *G05D 23/00* (2006.01)
- *F28D 15/00* (2006.01)
- *F24F 3/00* (2006.01)
- *F24F 3/04* (2006.01)
- *F24F 6/00* (2006.01)

(52) U.S. Cl. .............. 700/276; 700/277; 700/278; 62/92; 62/93; 62/427; 62/176.6; 165/104.19; 165/210; 165/229; 165/900; 239/34; 454/179

(58) Field of Classification Search .............. 700/276, 700/277, 278; 62/92, 93, 427, 176.6; 454/179; 239/34; 165/210, 229, 104.19, 900

See application file for complete search history.

(56) References Cited

U.S. PATENT DOCUMENTS

| | | | | |
|---|---|---|---|---|
| 4,197,714 | A * | 4/1980 | Bradshaw | 62/94 |
| 4,910,971 | A * | 3/1990 | McNab | 62/310 |
| 5,449,036 | A * | 9/1995 | Genge et al. | 165/104.19 |
| 5,449,275 | A | 9/1995 | Gluszek et al. | |
| 5,666,813 | A * | 9/1997 | Brune | 62/90 |
| 5,718,122 | A * | 2/1998 | Maeda | 62/185 |
| 5,850,968 | A | 12/1998 | Jokinen | |
| 5,915,473 | A * | 6/1999 | Ganesh et al. | 165/222 |
| 6,044,640 | A * | 4/2000 | Guimaraes | 60/783 |
| 6,079,483 | A | 6/2000 | Morooka et al. | |
| 6,427,454 | B1 | 8/2002 | West | |
| 6,530,160 | B1 * | 3/2003 | Gookins | 34/418 |
| 6,595,429 | B1 * | 7/2003 | Carlson et al. | 236/44 R |
| 6,711,907 | B1 * | 3/2004 | Dinnage et al. | 62/94 |
| 6,826,920 | B1 * | 12/2004 | Wacker | 62/176.6 |
| 2005/0077637 | A1 * | 4/2005 | Mockry et al. | 261/112.1 |
| 2005/0262720 | A1 * | 12/2005 | Rane et al. | 34/330 |

OTHER PUBLICATIONS

Patent abstracts of Japan, vol. 2000, No. 13, Feb. 5, 2001 & JP 2000 291994 A (TOYOTA Motor Corp), Oct. 20, 2000 abstract.

* cited by examiner

*Primary Examiner*—Ramesh Patel
(74) *Attorney, Agent, or Firm*—Richard P. Lange

(57) ABSTRACT

In a method of operating an air conditioning unit to reduce moisture varying operations, psychrometric chart data is accessed. In addition, a constraint is set on the relationship between the temperature of air supplied by the air conditioning unit and the relative humidity of the air supplied based upon information contained in the psychrometric chart data. The air conditioning unit is controlled based upon the constraint to thereby reduce moisture varying operations of the air conditioning unit.

29 Claims, 10 Drawing Sheets

AIR CONDITIONING UNIT CONTROL TO REDUCE MOISTURE VARYING OPERATIONS

BACKGROUND

A data center may be defined as a location, for instance, a room, that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate 200 or more systems. The computer systems typically include a number of printed circuit boards (PCBs), mass storage devices, power supplies, processors, micro-controllers, and semi-conductor devices, that dissipate relatively significant amounts of heat during their operation. For example, a typical computer system comprising multiple microprocessors dissipates approximately 250 W of power. Thus, a rack containing forty (40) computer systems of this type dissipates approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling air across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically consume a minimum of about thirty (30) percent of the required operating energy to sufficiently cool the data centers. The other components, for example, condensers and air movers (fans), typically consume an additional twenty (20) percent of the required total operating energy. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, for instance, fans and blowers. Conventional data center air conditioning units do not vary their cooling fluid output based on the distributed needs of the data center. Instead, these air conditioning units generally operate at or near a maximum compressor power even when the heat load is reduced inside the data center.

Conventional air conditioning units are typically operated based on a direct correlation between the opening of a chilled water mixing valve for chilled water units, and the speed of the compressor for direct expansion units, and the difference between the measured supply air temperature and a temperature set point, to enable cooling control. In addition, humidity control in conventional air conditioning units is driven by the difference between a relative humidity set point and the measured relative humidity. Temperature and humidity control in conventional air conditioning units typically work in isolation with respect to each other, thereby leading to wasted energy. More particularly, an increase in temperature set point drives the air conditioning unit into humidification while a decrease in temperature set point forces the air conditioning unit into dehumidification. Consequently, an air conditioning unit tends to consume a significant amount of power, for instance, around 2.2 kW per 1 gram of condensed moisture, in humidification and dehumidification.

Accordingly, it would be desirable to minimize the energy consumption of air conditioning units due to humidification and dehumidification.

SUMMARY

A method of operating an air conditioning unit to reduce moisture varying operations is disclosed. In the method, psychrometric chart data is accessed and a constraint is set on the relationship between the temperature of air supplied by the air conditioning unit and the relative humidity of the air supplied based upon information contained in the psychrometric chart data. In addition, the air conditioning unit is controlled based upon the constraint to thereby reduce moisture varying operations of the air conditioning unit.

BRIEF DESCRIPTION

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

As disclosed herein, air conditioning (AC) units may be controlled to substantially minimize the energy wasted through relatively unnecessary humidification and dehumidification operations. In one regard, humidity control and temperature control of the AC units may be combined based upon psychrometrics. More particularly, since relative humidity is a function of temperature, changes in supply air temperature of the AC units may change relative humidity measurements without any addition or removal of moisture to the supplied air. Such changes in relative humidity, without actual changes in absolute humidity, may drive the humidifier or dehumidifier, which may lead to wasted energy usage. In addition, the methods of AC unit control disclosed herein may also decrease the time taken by the AC unit to achieve new setpoints and to react to new loads.

Figure 1:
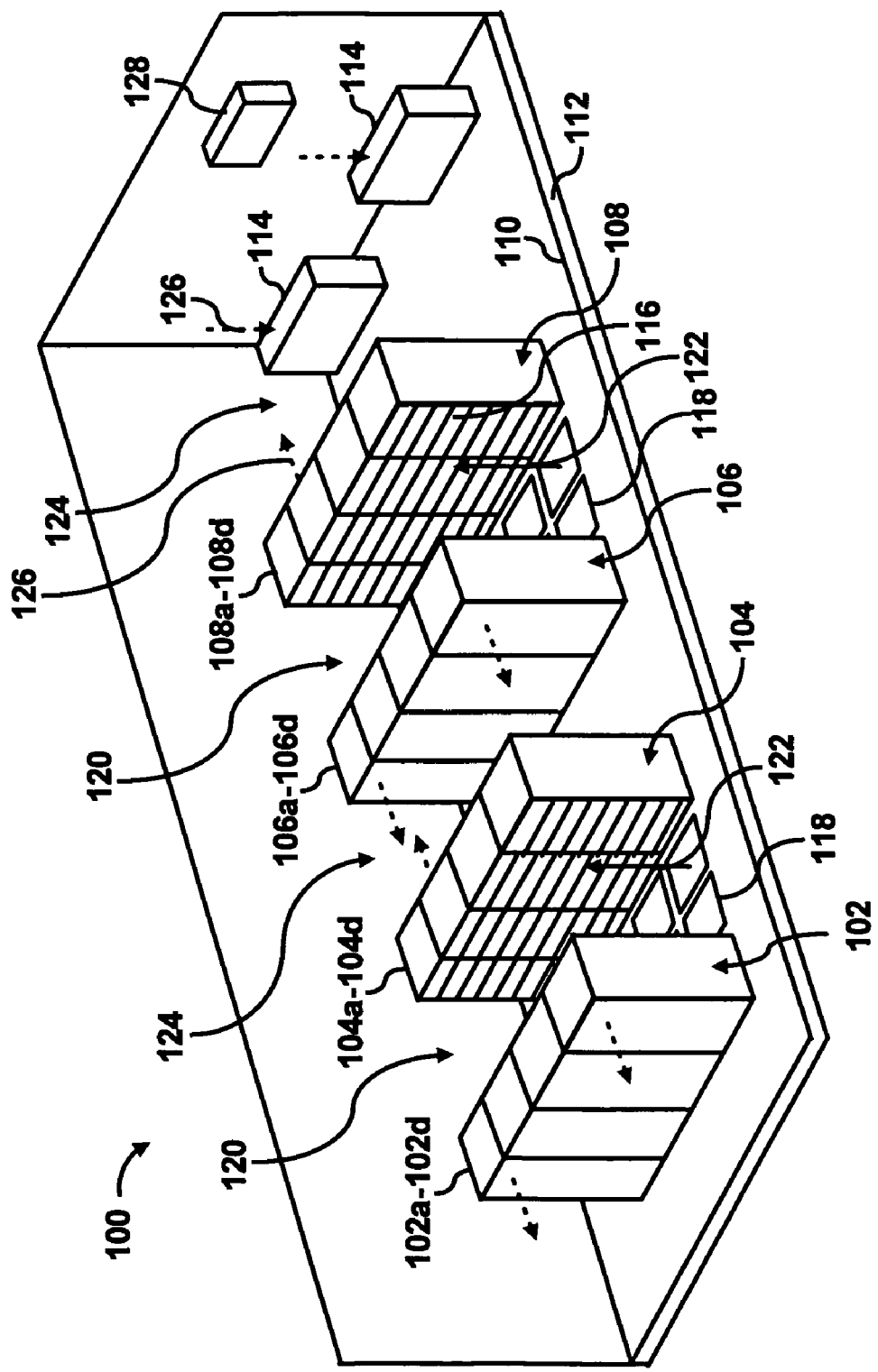
FIG. 1 shows a simplified perspective view of a data center in which various examples of the invention may be practiced.

With reference first to FIG. 1, there is shown a simplified perspective view of a data center 100 in which various examples of the invention may be practiced. The terms "data center" are generally meant to denote a room or other space where one or more components capable of generating heat may be situated. In addition, "data center" may also be defined as a room or building where one or more environmental conditions are to be controlled. In this respect, the terms "data center" are not meant to limit the invention to any specific type of room where data is communicated or processed, nor should it be construed that use of the terms "data center" limits the invention in any respect other than its definition hereinabove.

Although specific reference is made throughout the present disclosure to a data center 100, various principles and examples described herein may be employed in air conditioning units designed and used in other types of structures, buildings, etc. For instance, the various principles and examples described herein may be employed in air conditioning units configured for use in cooling rooms in a building, cooling automobiles, etc. Thus, the data center 100 referenced herein denotes an example of a suitable environment in which the air conditioners described herein may be employed and operated.

It should be readily apparent to those of ordinary skill in the art that the data center 100 depicted in FIG. 1 represents a generalized illustration and that other components may be added or existing components may be removed or modified without departing from the scope of the invention. For example, the data center 100 may include any number of racks and various other components. In addition, it should also be understood that heat generating/dissipating components may be located in the data center 100 without being housed in racks.

The data center 100 is depicted as having a plurality of racks 102–108, for instance, electronics cabinets, aligned in parallel rows. Each of the rows of racks 102–108 is shown as containing four racks (a–d) positioned on a raised floor 110. A plurality of wires and communication lines (not shown) may be located in a space 112 beneath the raised floor 110. The space 112 may also function as a plenum for delivery of cooled air from one or more air conditioning (AC) units 114 to the racks 102–108. The cooled air may be delivered from the space 112 to the racks 102–108 through vent tiles 118 located between some or all of the racks 102–108. The vent tiles 118 are shown as being located between racks 102 and 104 and 106 and 108.

The AC units 114 generally operate to cool received heated air as indicated by the arrows 126 and to supply the cooled air into the space 112. The AC units 114 may comprise, for instance, vapor-compression type air conditioning units, chiller type air conditioning units, etc. Examples of suitable AC units 114 may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety. In addition, the AC units 114 may include devices for humidifying or dehumidifying the received airflow prior to supplying the cooled airflow into the space 112. The AC units 114 are typically operated to either increase or decrease moisture levels in the airflow supplied into the space 112 based upon, for instance, the temperature set point the AC unit 114 is programmed to achieve in cooling the airflow. In this regard, an increase in temperature set point typically drives the AC unit 114 into humidification while a decrease in temperature set point typically forces the AC unit 114 into dehumidification. Consequently, AC units 114 are typically operated in energy inefficient manners. According to various examples described herein, the AC units 114 may be operated in manners to substantially limit the operations of the humidification and dehumidification devices to thereby reduce the energy consumed by the AC units 114 in supplying the data center 100 with cooled airflow. These examples are described in greater detail herein below.

The cooled air contained in the space 112 may include cooled air supplied by one or more AC units 114. Thus, characteristics of the cooled air, such as, temperature, humidity, pressure, flow rate, etc., may substantially be affected by operations of one or more of the AC units 114. By way of example, the cooled air supplied by one AC unit 114 may mix with cooled air supplied by another AC unit 114. In this regard, characteristics of the cooled air at various areas in the space 112 and the cooled air supplied to the racks 102–108 may vary, for instance, if the temperatures or the volume flow rates of the cooled air supplied by these AC units 114 differ due to mixing of the cooled air. In certain instances, the level of influence of an AC unit 114 over the racks 102–108 may be higher for those racks 102–108 that are in closer proximity to the AC unit 114. In addition, the level of influence of an AC unit 114 over the racks 102–108 may be lower for those racks 102–108 that are located farther away from the AC unit 114.

The vent tiles 118 may comprise static vent tiles, manually adjustable vent tiles, and/or the dynamically controllable vent tiles disclosed and described in commonly assigned U.S. Pat. No. 6,574,104, the disclosure of which is hereby incorporated by reference in its entirety. As described in the '104 patent, the vent tiles 118 may be termed "dynamically controllable" because they generally operate to control at least one of velocity, volume flow rate and direction of the cooled airflow therethrough. In addition, specific examples of dynamically controllable vent tiles 118 may be found in co-pending U.S. application Ser. No. 10/351,427, filed on Jan. 27, 2003, which is assigned to the assignee of the present invention and is incorporated by reference herein in its entirety.

The racks 102–108 are generally configured to house a plurality of components 116 capable of generating/dissipating heat (not shown), for instance, processors, micro-controllers, high-speed video cards, memories, semi-conductor devices, and the like. The components 116 may be elements of a plurality of subsystems (not shown), for instance, computers, servers, bladed servers, etc. The subsystems and the components may be implemented to perform various electronic, for instance, computing, switching, routing, displaying, and the like, functions. In the performance of these electronic functions, the components, and therefore the subsystems, may generally dissipate relatively large amounts of heat. Because the racks 102–108 have generally been known to include upwards of forty (40) or more subsystems, they may transfer substantially large amounts of heat to the cooled air flowing therethrough to maintain the subsystems and the components generally within predetermined operating temperature ranges.

The areas between the racks 102 and 104 and between the racks 106 and 108 may comprise cool aisles 120. These aisles are considered "cool aisles" because they are configured to receive cooled airflow from the vent tiles 118, as generally indicated by the arrows 122. In addition, the racks 102–108 generally receive cooled air from the cool aisles 120. The aisles between the racks 104 and 106, and on the rear sides of racks 102 and 108, are considered hot aisles 124. These aisles are considered "hot aisles" because they are positioned to receive air that has been heated by the components 116 in the racks 102–108, as indicated by the arrows 126. By substantially separating the cool aisles 120 and the hot aisles 124, for instance, with the racks 102–108, the heated air may substantially be prevented from re-circulating with the cooled air prior to delivery into the racks 102–108. In addition, the cooled air may also substantially be prevented from re-circulating with the heated air prior to returning to the AC units 114. However, there may be areas in the data center 100 where re-circulation of the cooled air and the heated air occurs. By way of example, cooled air may mix with heated air around the sides or over the tops of one or more of the racks 102–108.

The sides of the racks 102–108 that face the cool aisles 120 may be considered as the fronts of the racks and the sides of the racks 102–108 that face away from the cool aisles 120 may be considered as the rears of the racks 102–108. For purposes of simplicity and not of limitation, this nomenclature will be relied upon throughout the present disclosure to describe the various sides of the racks 102–108.

According to another example, the racks 102–108 may be positioned with their rear sides adjacent to one another (not shown). In this embodiment, the vent tiles 118 may be provided in each aisle 120 and 124. In addition, the racks 102–108 may comprise outlets on top panels thereof to enable heated air to flow out of the racks 102–108.

Also shown in FIG. 1 is a computing device 128 configured to control various operations of the data center 100. The computing device 128 may be configured, for instance, to control operations of the AC units 114. In one regard, the computing device 128 may control the AC units 114 to vary the temperature, humidity levels, and volume flow rates of the air supplied by the AC units 114, in manners as described hereinbelow. Although the computing device 128 is illustrated in FIG. 1 as forming a component separate from the components 116 housed in the racks 102–108, the computing device 128 may comprise one or more of the components 116 without departing from a scope of the data center 100 disclosed herein.

The data center 100 is illustrated in FIG. 1 as containing four rows of racks 102–108 and two AC units 114 for purposes of simplicity and illustration. Thus, the data center 100 should not be limited in any respect based upon the number of racks 102–108 and AC units 114 illustrated in FIG. 1. In addition, although the racks 102–108 have all been illustrated similarly, the racks 102–108 may comprise heterogeneous configurations. For instance, the racks 102–108 may be manufactured by different companies or the racks 102–108 may be designed to house differing types of components 116, for example, horizontally mounted servers, bladed servers, etc.

Figure 2A:
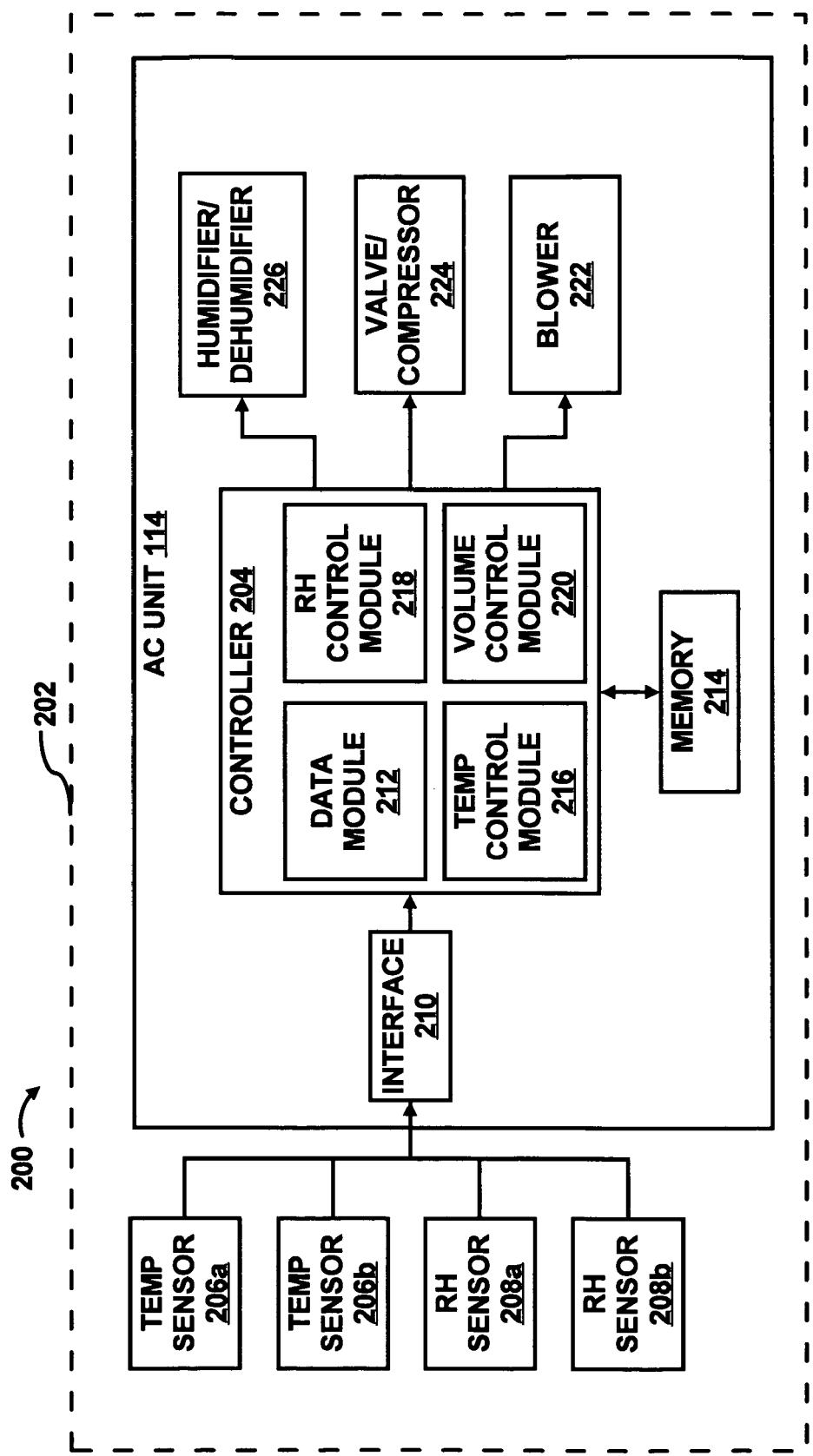
FIGS. 2A and 2B are respective block diagrams of AC unit control systems according to embodiments of the invention.

With reference now to FIG. 2A, there is shown a block diagram 200 of an AC unit 114 control system 202. It should be understood that the following description of the block diagram 200 is but one manner of a variety of different manners in which such a control system 202 may be operated. In addition, it should be understood that the control system 202 may include additional components and that some of the components described may be removed and/or modified without departing from a scope of the control system 202.

As shown in FIG. 2A, the AC unit 114 includes a controller 204. The controller 204 is generally configured to control operations of the AC unit 114. In this regard, the controller 204 may, for instance, comprise a computing device configured to control the operations of the AC unit 114 and may be integrally fabricated with the AC unit 114. Alternatively, the controller 204 may comprise the computing device 128 shown in FIG. 1 and may comprise a computing device that is separate from the AC unit 114. An example of this type of arrangement is described herein below with respect to FIG. 2B. The controller 204 may also comprise a different computing device, a microprocessor, a micro-controller, an application specific integrated circuit (ASIC), and the like. In general, the controller 204 is configured to receive data from variously located sensors, to process the data, and to control various components of the AC unit 114 as described in greater detail hereinbelow.

The control system 202 also includes a plurality of sensors 206a, 206b, 208a, 208b configured to detect, for instance, environmental conditions in various locations of the data center 100. As shown, sensors 206a and 206b comprise temperature sensors and sensors 208a and 206b comprise relative humidity (RH) sensors. The temperatures sensors 206a and 206b may comprise any reasonably suitable sensors capable of detecting temperatures and may thus comprise, for instance, thermistors, thermocouples, and the like. The RH sensors 208a and 208b may comprise commercially available RH sensors, for instance, integrated circuits configured to detect relative humidities. In addition, one or both of the temperature sensors 206a and 206b may be integrally formed with one or both of the RH sensors 208a and 208b. In this regard, a single integrated circuit may be employed to detect both temperature and relative humidity.

Although the sensors 206a, 206b, 208a, 208b are illustrated in FIG. 2A as being separate from the AC unit 114, the sensors 206a, 206b, 208a, 208b may be installed during manufacture or following installation of the AC unit 114. In any regard, the temperature sensor 206a may, for instance, be positioned to detect the temperature of airflow supplied into the AC unit 114. In addition, the RH sensor 208a may be positioned to detect the relative humidity of the airflow supplied into the AC unit 114. The temperature sensor 206b and the RH sensor 208b may, for instance, be positioned to detect the temperature and relative humidity, respectively, of the airflow supplied by the AC unit 114.

The data collected by the sensors 206a, 206b, 208a, 208b may be transmitted or otherwise sent to the controller 204. The data may be transmitted through an interface 210, which may comprise any reasonably suitable device and/or software capable of directing the data flow from the sensors 206*a*, 206*b*, 208*a*, 208*b* to the controller 204. The interface 210 may thus comprise, for instance, wired connections or wireless connections, such as IEEE 801.11b, 801.11g, wireless serial connection, Bluetooth, etc., or combinations thereof. The transmitted data may be received by a data module 212 of the controller 204.

The data module 212 may comprise software and/or hardware configured to receive data from the sensors 206*a*, 206*b*, 208*a*, 208*b* and to store the information in, for instance, a memory 214, configured to store the data. Although the data module 212 is depicted as being included in the controller 204, the data module 212 may comprise an algorithm stored in the memory 214, which the controller 204 may access and execute. The memory 214 may also generally be configured to provide storage of software that provides the functionality of the controller 204. In one regard, the memory 214 may be implemented as a combination of volatile and non-volatile memory, such as DRAM, EEPROM, flash memory, and the like.

The controller 204 also includes a temperature control module 216 configured to control various components of the AC unit 114 that affect the temperature of the air supplied by the AC unit 114. Again, although the temperature control module 216 is depicted as being included in the controller 204, the temperature control module 216 may comprise an algorithm stored in the memory 214, which the controller 204 may access and execute. In general, the temperature control module 216 operates to determine a difference between a detected temperature and a set point temperature and to control one or more components of the AC unit 114 to vary the temperature of the supply air temperature in response to the difference in temperatures. In addition, the temperature control module 216 may operate to vary the set point temperature, for instance, based upon user defined inputs, programming, various changes in environmental conditions in the data center 100, etc.

The controller 204 further includes an RH control module 218, which is configured to control various components of the AC unit 114 that affect the relative humidity of the air supplied by the AC unit 114, as described in greater detail herein below. Again, although the RH control module 218 is depicted as being included in the controller 204, the RH control module 218 may comprise an algorithm stored in the memory 214, which the controller 204 may access and execute. In general, the RH control module 218 operates to determine a difference between a detected relative humidity level and a set point relative humidity level and to control one or more components of the AC unit 114 to vary humidification or dehumidification of the supply air in response to the difference in relative humidity levels. In addition, the RH control module 218 may operate to vary the set point relative humidity level, for instance, based upon user defined inputs, programming, various changes in environmental conditions in the data center 100, etc. In one regard, the RH control module 218 may vary the relative humidity level set point based upon changes to the temperature set point in various manners as described herein below.

The speed and/or the volume flow rate of airflow supplied by the AC unit 114 may be controlled by a volume control module 220 of the controller 204. The volume control module 220 may also comprise an algorithm stored in the memory 214, which the controller 204 may access and execute. The volume control module 220 may control a variable frequency drive to vary the operations of a blower 222 configured to force airflow from the AC unit 114 into the space 112.

The controller 204 may control the temperature of the airflow supplied by the AC unit 114 through operation of a two-way or three-way valve in a water-chiller type air conditioning unit. In addition, the controller 204 may control the temperature through varying the operations of a compressor in a vapor-compression type air conditioning unit. The two-way valve, three-way valve, and compressor have been generically labeled as the valve/compressor 224 in FIG. 2A for purposes of simplicity. The two-way valve, three-way valve, and compressor 224 may be operated to vary airflow temperature in manners generally known to those of ordinary skill in the art.

The controller 204 may also control the moisture content in the airflow supplied by the AC unit 114 through control of a humidifier/dehumidifier 226. In general, the controller 204 is configured to control the humidity and temperature of the supplied air based upon psychrometrics. More particularly, since relative humidity is a function of temperature, changes in supply air temperature of the AC unit 114 may change relative humidity measurements without any addition or removal of moisture to the supplied air. Such changes in relative humidity, without actual changes in absolute humidity, may cause the controller 204 to operate the humidifier/dehumidifier, which may lead to wasted energy usage. In this regard, the controller 204 may control the AC unit 114 to substantially minimize the energy used by the AC unit 114 to either extract or add moisture into the supplied airflow. Various manners in which the controller 204 may control the AC unit 114 based upon psychrometrics is described in greater detail with respect to FIGS. 4A–4C.

Figure 2B:
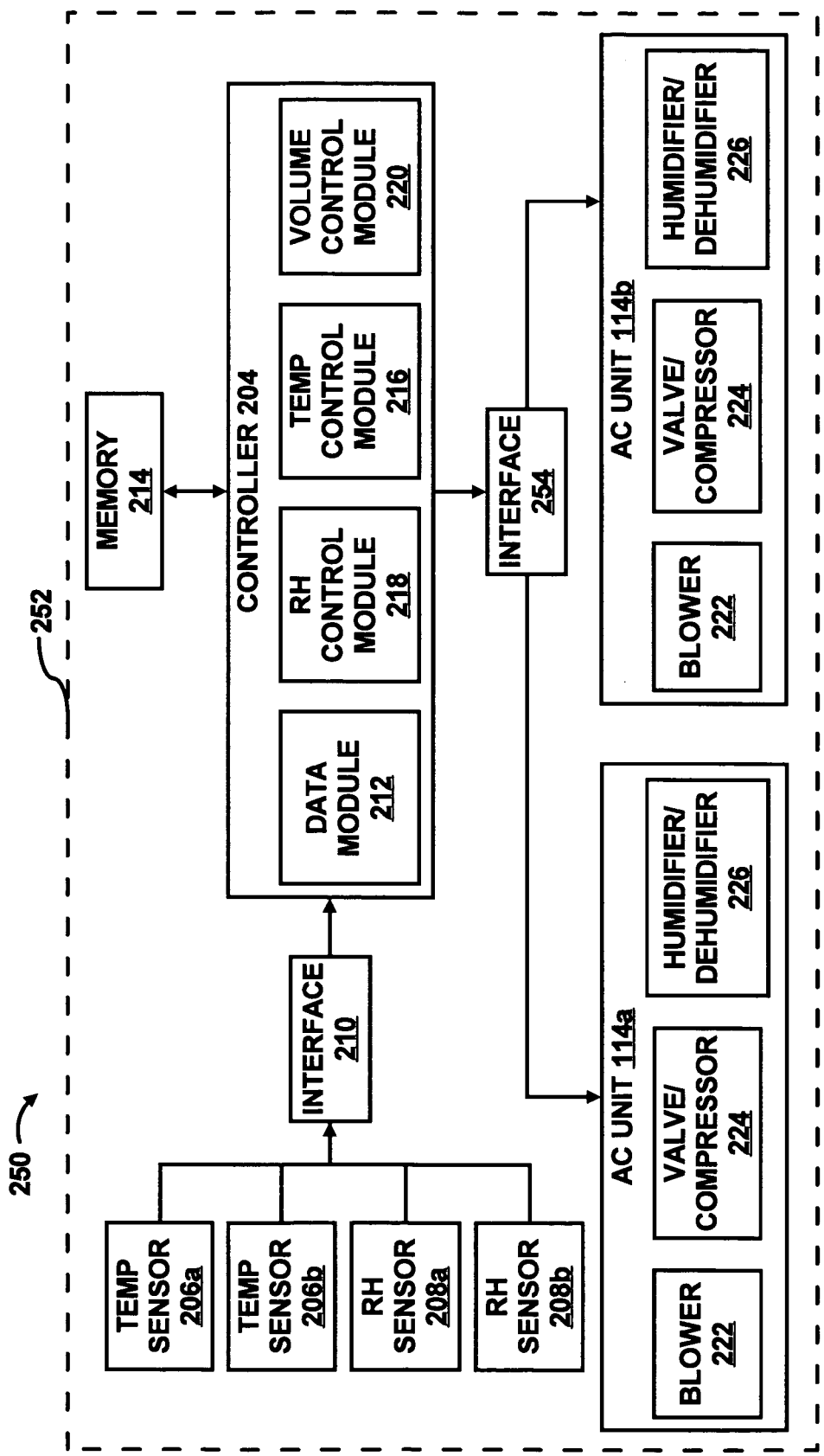

With reference first, however, to FIG. 2B, there is shown a block diagram 250 of an AC unit control system 252 according to another example of the invention. It should be understood that the following description of the block diagram 250 is but one manner of a variety of different manners in which such a control system 252 may be operated. In addition, it should be understood that the control system 252 may include additional components and that some of the components described may be removed and/or modified without departing from a scope of the control system 252.

The AC unit control system 252 includes most of the components depicted in FIG. 2A. Therefore a detailed description of the common components will not be described in detail with respect to FIG. 2B. Instead, the description set forth above with respect to FIG. 2A is relied upon to provide a sufficient description of the common components. In addition, a description of the differences will be set forth herein below with respect to FIG. 2B.

Initially, it may be seen in FIG. 2B that the controller 204 includes all of the modules contained in the controller 204 disclosed hereinabove with respect to FIG. 2A. In this regard, the controller 204, and the modules contained therein, generally operates in manners similar to the controller 204 disclosed with respect to FIG. 2A. However, the controller 204 shown in FIG. 2B may be separate from and configured to control a plurality of AC units 114*a* and 114*b* and may thus comprise the computing device 128 illustrated in FIG. 1. In this regard, the controller 204 may operate as the controller for the AC units 114*a* and 114*b* and may thus transmit or otherwise send instructions to the AC units 114*a* and 114*b*. The instructions sent by the controller 204 may sent through an interface 254 configured to enable communications between the controller 204 and the AC units 114*a* and 114*b*. The interface 254 may comprise any reasonably suitable device and/or software capable of directing the data flow from the sensors 206*a*, 206*b*, 208*a*, 208*b* to the controller 204. The interface 210 may thus comprise, for instance, wired connections or wireless connections, such as IEEE 801.11b, 801.11g, wireless serial connection, Bluetooth, etc., or combinations thereof.

Consequently, the control system 252 is configured to control operations of a plurality of AC units 114a and 114b. In one example, the controller 204 may control the AC units 114a and 114b to control operations of the humidifier/dehumidifier 226 to substantially reduce the overall energy consumption in the AC units 114a and 114b to thereby reduce the costs associated with operating the AC units 114a and 114b.

Figure 3:
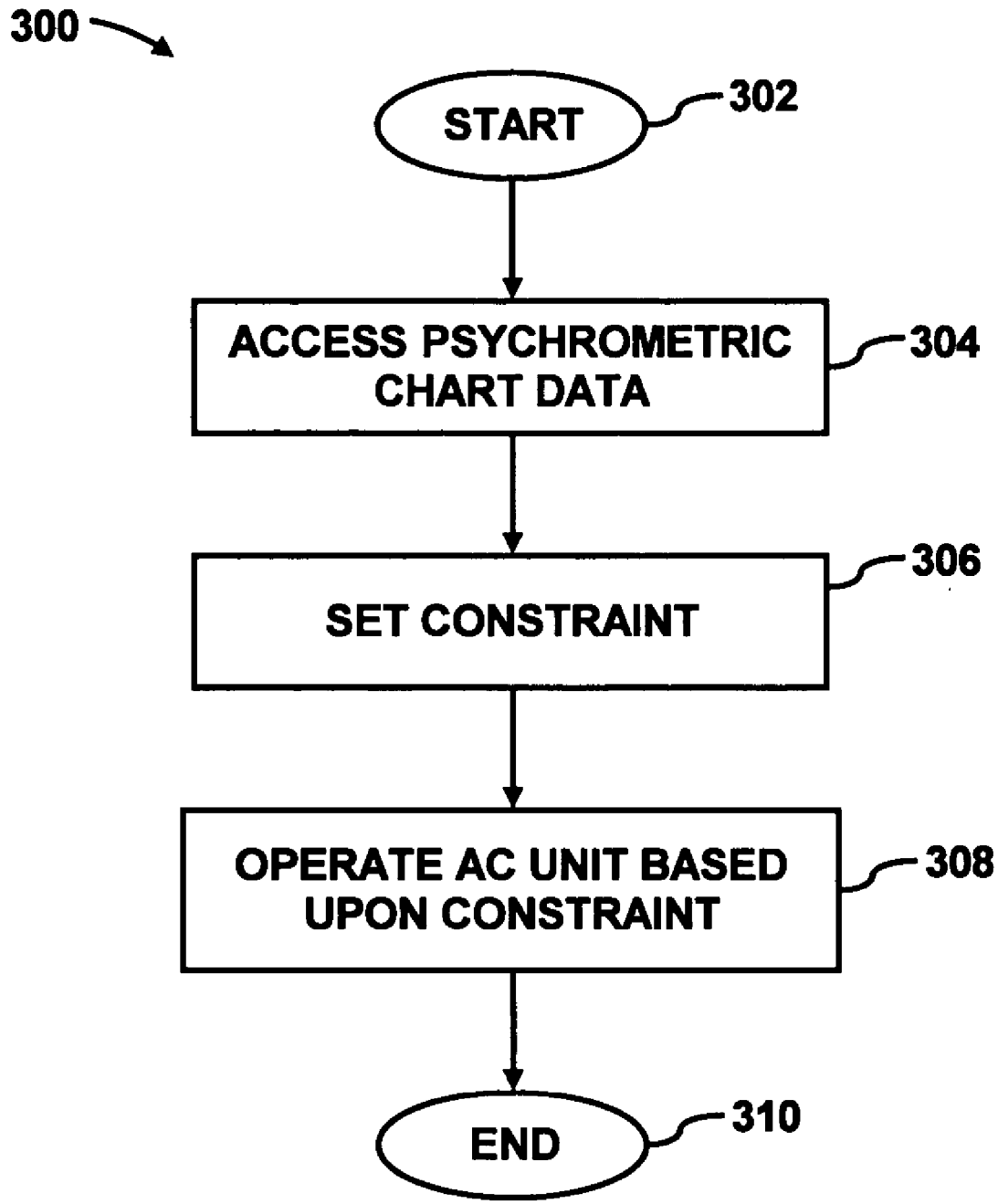
FIG. 3 illustrates a flow diagram of an operational mode for controlling an AC unit based on psychrometrics, according to an embodiment of the invention.

FIG. 3 illustrates a flow diagram of an operational mode 300 for controlling an AC unit 114 based on psychrometrics. It is to be understood that the following description of the operational mode 300 is but one manner of a variety of different manners in which an embodiment of the invention may be practiced. It should also be apparent to those of ordinary skill in the art that the operational mode 300 represents a generalized illustration and that other steps may be added or existing steps may be removed, modified or rearranged without departing from the scope of the operational mode 300.

The description of the operational mode 300 is made with reference to the block diagrams 200 and 250 illustrated in FIGS. 2A and 2B, respectively, and thus makes reference to the elements cited therein. It should, however, be understood that the operational mode 300 is not limited to the elements set forth in the block diagrams 200 and 250. Instead, it should be understood that the operational mode 300 may be practiced by an AC unit control system having a different configuration than those set forth in the block diagrams 200 and 250. In addition, although particular reference is made to a single AC unit 114, the operational mode 300 may be performed on a plurality of AC units 114 as, for instance, in a multi-AC unit data center 100.

Figure 5A:
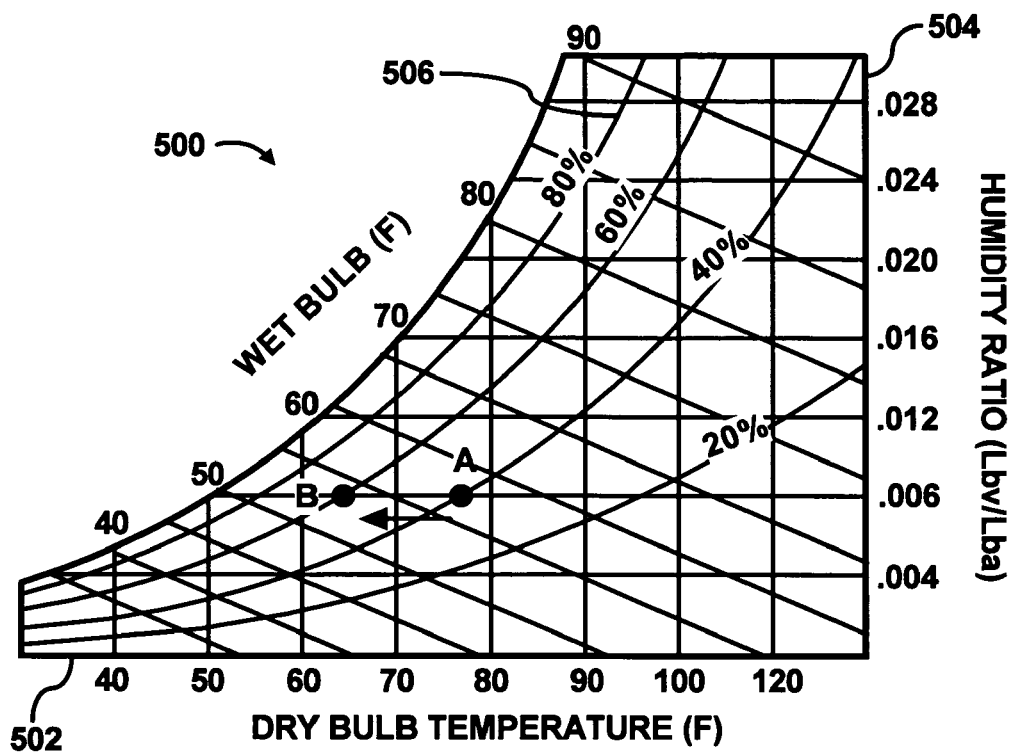
FIGS. 5A–5C illustrate respective psychrometric charts illustrating examples of the invention.

The operational mode 300 may be initiated in response to a variety of stimuli at step 302. For example, the operational mode 400 may be initiated in response to a predetermined lapse of time, in response to receipt of a transmitted signal, manually initiated, etc. At step 304, a psychrometric chart data may be accessed. The psychrometric chart data may pertain to information contained in a pyschrometric chart, such as, the psychrometric chart 500 illustrated in FIG. 5A.

At step 306, a constraint on the relationship between the temperature of air supplied by the AC unit 114 and the relative humidity of the supplied air based upon information contained in the psychrometric chart data may be set. In addition, at step 308, the AC unit 114 may be operated based upon the constraint. Various examples of constraints and AC unit 114 operations based upon these constraints are set forth in detail hereinbelow with respect to FIGS. 4A–4C.

At step 310, the operational mode 300 may be discontinued, for instance, if the AC unit 114 is powered down, after a predefined period of time, after a predefined number of iterations, under an intermittent operational scheme, etc. Alternatively, the operational mode 300 may continue for a relatively indefinite period of time or until the operational mode 300 is manually discontinued.

Figure 4A:
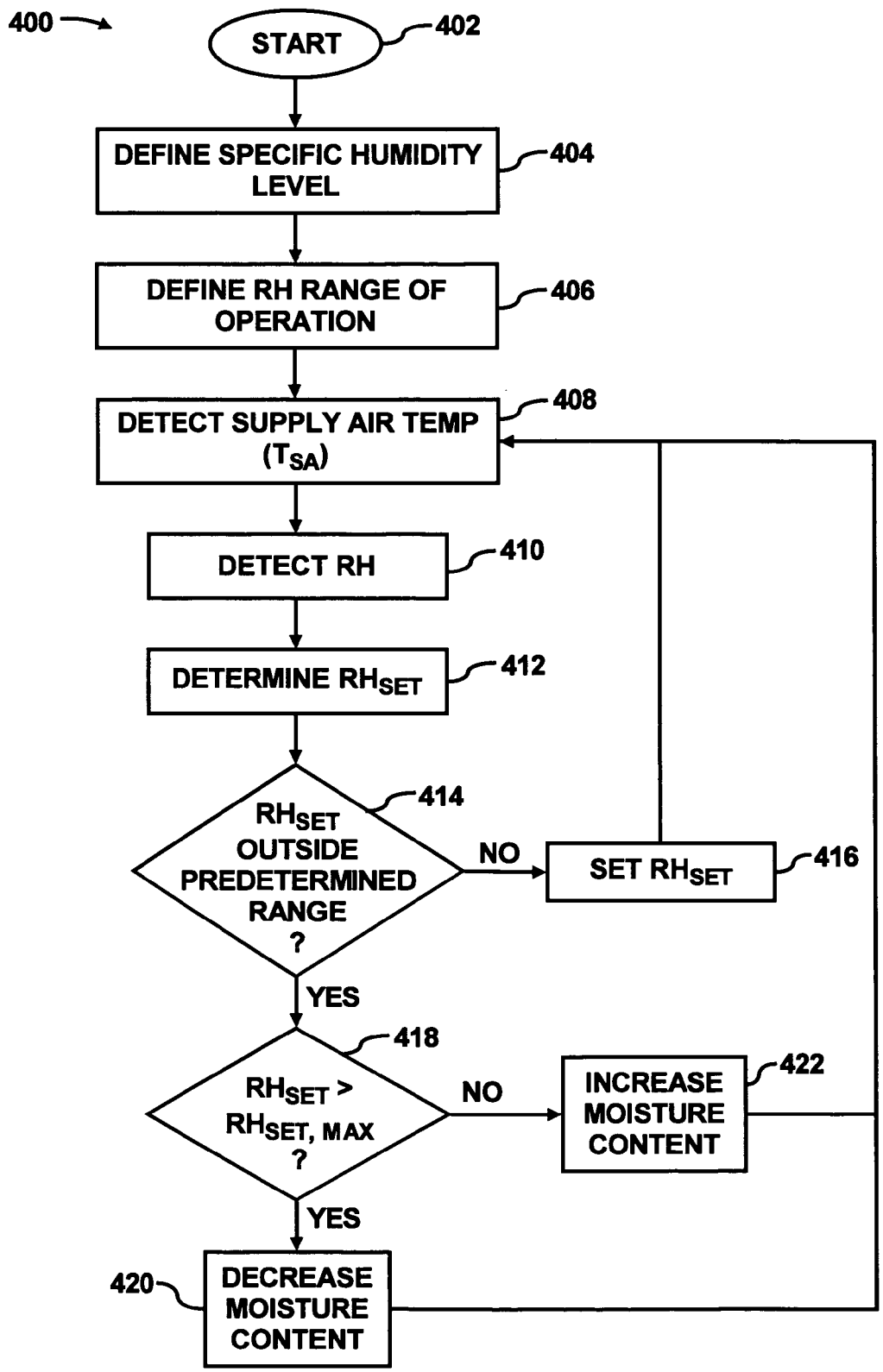
FIG. 4A illustrates a flow diagram of an operational mode for controlling an AC unit based on psychrometrics, according to a first example of an embodiment of the invention.

FIG. 4A illustrates a flow diagram of an operational mode 400 for controlling an AC unit 114 based on psychrometrics, according to a first example. It is to be understood that the following description of the operational mode 400 is but one manner of a variety of different manners in which an embodiment of the invention may be practiced. It should also be apparent to those of ordinary skill in the art that the operational mode 400 represents a generalized illustration and that other steps may be added or existing steps may be removed, modified or rearranged without departing from the scope of the operational mode 400.

The description of the operational mode 400 is made with reference to the block diagrams 200 and 250 illustrated in FIGS. 2A and 2B, respectively, and thus makes reference to the elements cited therein. It should, however, be understood that the operational mode 400 is not limited to the elements set forth in the block diagrams 200 and 250. Instead, it should be understood that the operational mode 400 may be practiced by an AC unit control system having a different configuration than those set forth in the block diagrams 200 and 250. In addition, although particular reference is made to a single AC unit 114, the operational mode 400 may be performed on a plurality of AC units 114 as, for instance, in a multi-AC unit data center 100.

In general, the operational mode 400 may be employed to reduce energy consumption of the AC unit 114 by varying the relative humidity (RH) set point at which the AC unit 114 operates the humidifier/dehumidifier 226. In addition, the operational mode 400 generally operates to maintain a constant level of specific humidity by varying the RH set point. The RH set point may be defined as a threshold at which the humidifier/dehumidifier 226 is activated. For instance, if the relative humidity exceeds a maximum RH set point, the humidifier/dehumidifier 226 may be activated to remove some of the moisture content from the air. Alternatively, if the relative humidity falls below a minimum RH set point, the humidifier/dehumidifier 226 may be activated to supply additional moisture into the air. In the operational mode 400, the RH set point may be varied to substantially maintain the specific humidity (or humidity ratio) of the air, which may be defined as the ratio of the mass of water to the mass of dry air in a given volume of moist air.

The operational mode 400 may be initiated in response to a variety of stimuli at step 402. For example, the operational mode 400 may be initiated in response to a predetermined lapse of time, in response to receipt of a transmitted signal, manually initiated, etc. At step 404, the desired specific humidity level may be defined. The desired specific humidity level may be defined based upon various considerations. For instance, the desired specific humidity level may be defined according to safe operating conditions for the components 116 housed in the data center 100. As another example, the desired specific humidity level may be defined to yield a comfortable environment in the data center 100 for users. In any respect, the desired specific humidity level may be programmed into the RH control module 218.

In addition, a predetermined RH range of operation may be defined at step 406. The predetermined RH range may be defined as a range of relative humidity levels that may be predetermined according to various factors. For instance, the predetermined range may be set such that the relative humidity levels remain within safe operating levels for the components 116 contained in the data center 100. The predetermined range may thus include a RH set point maximum ($RH_{SET,MAX}$) as an upper limit and a RH set point minimum ($RH_{SET,MIN}$) as a lower limit. By way of example, the RH set point maximum may be set to 80% and the RH set point minimum may be set to 40% to reduce adverse effects caused by overabundant or insufficient moisture in the air. In any respect, the predetermined RH range may be programmed into the RH control module 218.

The temperature of the airflow supplied ($T_{SA}$) by the AC unit 114 may be detected by a temperature sensor 206b as indicated at step 408 and the relative humidity of the airflow supplied into the AC unit 114 may be detected by an RH sensor 208a as indicated at step 410. In addition, the detected temperature and relative humidity data may be sent to the controller 204, and more particularly to the data module 212. The RH control module 218 may determine a RH set point ($RH_{SET}$) based upon the detected temperature as indicated at step 412. More particularly, at step 412, the RH control module 218 may access a psychrometric chart stored, for instance, in the memory 214. The psychrometric chart may comprise data points similar to those in the psychrometric graph 500 depicted in FIG. 5A. The psychrometric graph 500 includes a dry bulb temperature axis 502, a humidity ratio axis 504 and wet bulb lines 506. The psychrometric graph 500 depicts relationships between the dry bulb temperature, the humidity, and the wet bulb temperature. Thus, for instance, if the dry bulb temperature and the humidity ratio is known, the wet bulb temperature may be determined based upon the psychrometric graph 500.

The controller 204 may determine the RH set point based upon the detected temperature of the airflow supplied by the AC unit 114. For instance, in the example illustrated in FIG. 5A, the temperature of the airflow supplied by the AC unit 114 is detected at step 408 as being approximately 78° F. Thus, at step 412, the controller 204 may determine that the RH set point is 40%, as indicated by the letter "A". At step 414, the controller 204 may determine whether the RH set point is outside of the predetermined RH range defined at step 406.

If the controller 204 determines that the RH set point is within the predetermined range, the controller 204 may set the RH set point to the level determined at step 412, as indicated at step 416. Alternatively, the controller 204 may enact logic designed to control the AC unit 114 from changing the moisture content in the airflow supplied by the AC unit 114. In addition, steps 408–416 may be repeated to thereby vary the RH set point with changing supply air temperatures and substantially prevent the humidifier/dehumidifier 226 from operating unnecessarily. Thus, for instance, with reference back to FIG. 5A, if the supply air temperature were to decrease to 64° F., the controller 204 may determine that the RH set point should be set to 60%, as indicated by the letter "B", so long as the RH set point is within the predetermined range.

If at step 414, the controller 204 determines that the RH set point is outside of the predetermined range, the controller 204 may determine whether the RH set point exceeds the RH set point maximum at step 418. If the controller 204 determines that the RH set point exceeds the RH set point maximum at step 418, the controller 204 may decrease the moisture content in the airflow supplied by the AC unit 114 by activating the dehumidifier 226 at step 420. On the other hand, if the controller 204 determines that the RH set point falls below the RH set point minimum, the controller 204 may increase the moisture content in the airflow supplied by the AC unit 114 by activating the humidifier 226 at step 422.

Following either of steps 420 and 422, steps 408–422 may be repeated to thus reduce the energy consumed in operating the AC unit 114 while maintaining relative humidity levels in the data center 100 within predefined limits. In addition, the operational mode 400 may continue indefinitely, or it may be discontinued, for instance, if the AC unit 114 is powered down, after a predefined period of time, after a predefined number of iterations, under an intermittent operational scheme, etc.

Figure 4B:
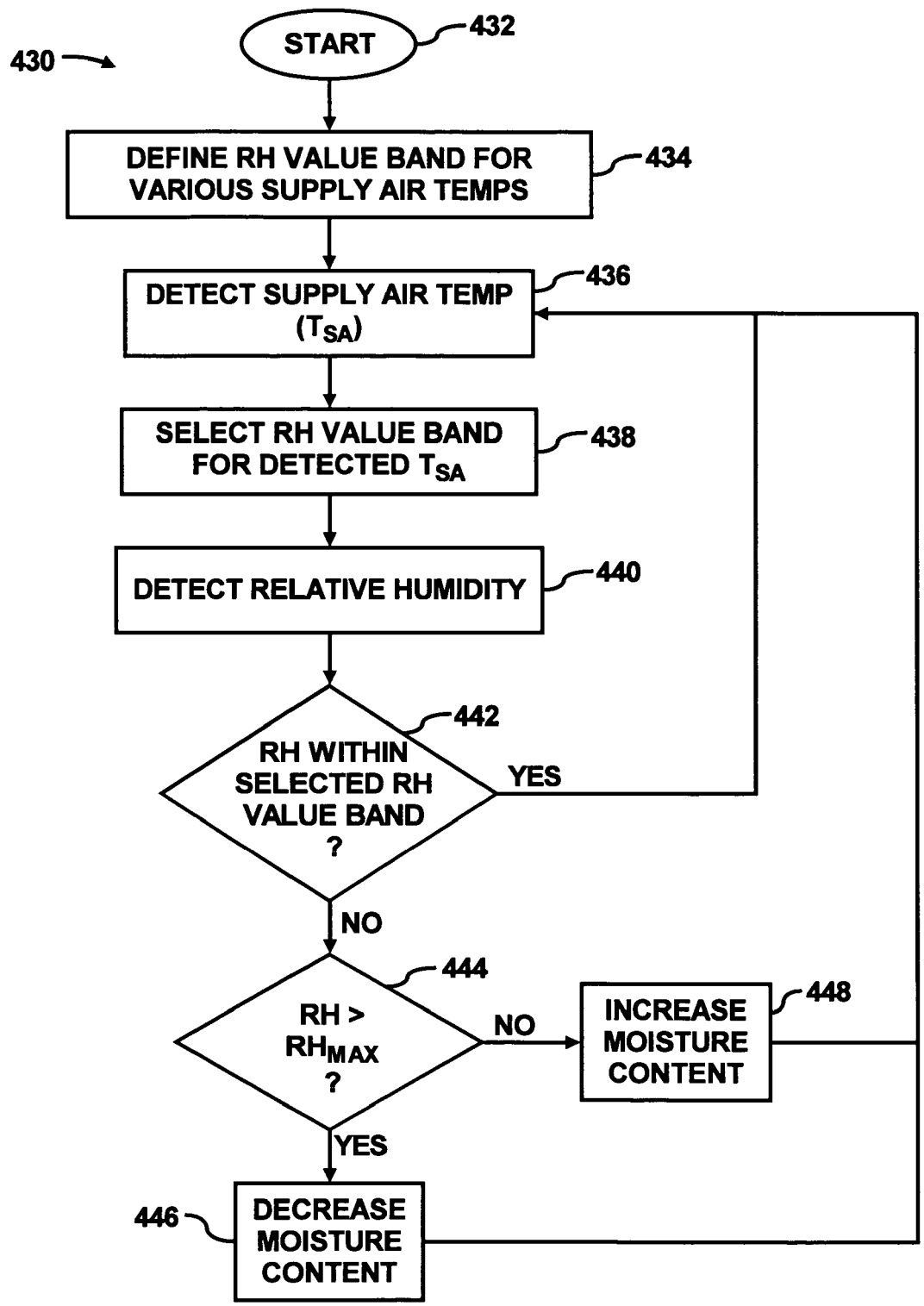
FIG. 4B illustrates a flow diagram of an operational mode for controlling an AC unit based on psychrometrics, according to a second example of an embodiment of the invention.

FIG. 4B illustrates a flow diagram of an operational mode 430 for controlling an AC unit 114 based on psychrometrics, according to a second example. It is to be understood that the following description of the operational mode 430 is but one manner of a variety of different manners in which an embodiment of the invention may be practiced. It should also be apparent to those of ordinary skill in the art that the operational mode 430 represents a generalized illustration and that other steps may be added or existing steps may be removed, modified or rearranged without departing from the scope of the operational mode 430.

The description of the operational mode 430 is made with reference to the block diagrams 200 and 250 illustrated in FIGS. 2A and 2B, respectively, and thus makes reference to the elements cited therein. It should, however, be understood that the operational mode 430 is not limited to the elements set forth in the block diagrams 200 and 250. Instead, it should be understood that the operational mode 430 may be practiced by an AC unit control system having a different configuration than those set forth in the block diagrams 200 and 250. In addition, although particular reference is made to a single AC unit 114, the operational mode 430 may be performed on a plurality of AC units 114 as, for instance, in a multi-AC unit data center 100.

The operational mode 430 may generally be employed to provide consistent levels of comfort and operational conditions at different temperatures. The operational mode 430 operates by specifying minimum and maximum allowable RH values for all AC unit 114 supply air temperatures. The band of RH values formed with the minimum and maximum allowable RH values generally specifies the region of AC unit 114 operation for the humidity control. This band of RH values may be based upon known RH values that are comfortable and provide for suitable operational conditions. By way of example, for a given AC unit 114 supply air temperature, the humidifier/dehumidifier 226 may activate when the measured relative humidity is outside of the RH value band. Through implementation of the operational mode 430, a comfortable environment may be created while enabling the components 116 to operated in a relatively safe manner.

The operational mode 430 may be initiated in response to a variety of stimuli at step 432. For example, the operational mode 430 may be initiated in response to a predetermined lapse of time, in response to receipt of a transmitted signal, manually initiated, etc. At step 434, RH value bands formed of minimum and maximum allowable RH values may be defined for various AC unit 114 supply air temperatures. In one example, the RH value bands may be defined for all of the potential temperatures of the airflow supplied by the AC unit 114. The RH value bands may be determined through, for instance, testing to determine at which relative humidity levels desired comfort levels are achieved for each of the various supply air temperatures. In any respect, the defined RH value bands may be programmed into the RH control module 218 and they may be stored in the memory 214.

Figure 5B:
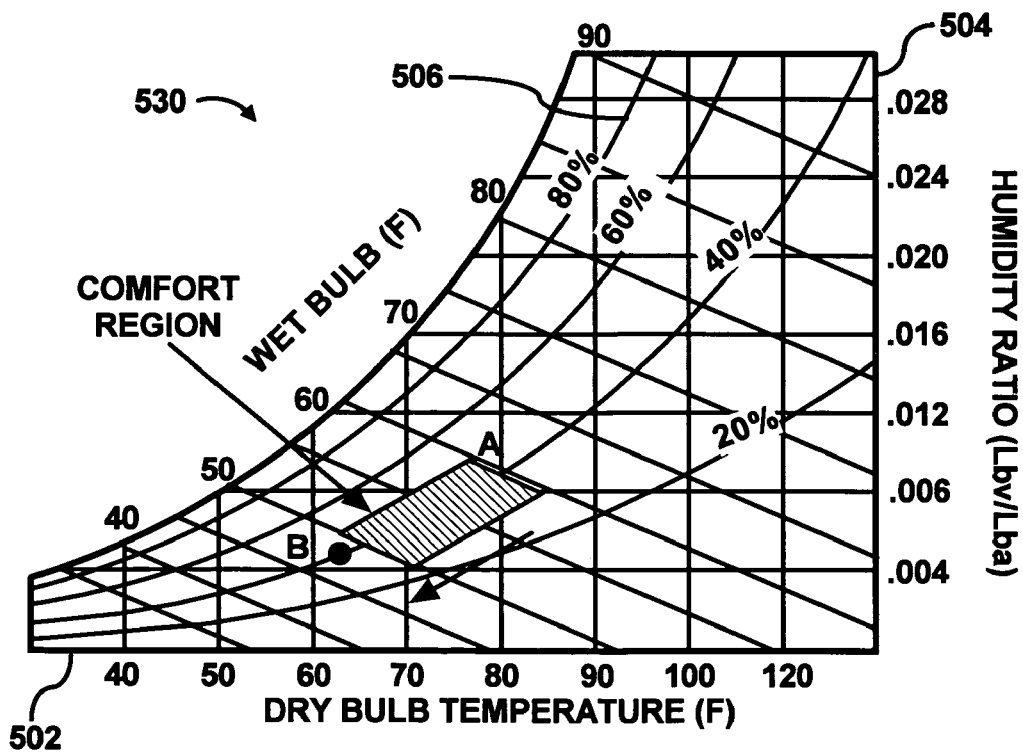

The controller 204 may also access a psychrometric chart stored, for instance, in the memory 214 to define the RH value band at step 434. The psychrometric chart may comprise data points similar to those in the psychrometric graph 530 depicted in FIG. 5B. The psychrometric graph 530 includes a dry bulb temperature axis 502, a humidity ratio axis 504 and wet bulb lines 506. Thus, with reference to the example illustrated in the psychrometric chart 530, the controller 204 may define the RH value band for a supply air temperature of 78° F. as shown in the shaded region labeled "Comfort Region".

The temperature of the airflow supplied ($T_{SA}$) by the AC unit 114 may be detected by a temperature sensor 206b as indicated at step 436. In addition, the detected temperature data may be sent to the controller 204, and more particularly to the data module 212. At step 438, the controller 204 may select the particular RH value band defined at step 434 that corresponds to the air supply temperature detected at step 436.

The relative humidity of the airflow supplied by the AC unit 114 may be detected by a relative humidity sensor 208b as indicated at step 440. In addition, the detected relative humidity data may be sent to the controller 204, and more particularly to the data module 212. At step 442, the controller 204 may determine whether the detected relative humidity is within the RH value band selected at step 438. Thus, with reference to the example illustrated in FIG. 5B, if the detected temperature is 78° F. and the RH value band is defined as the shaded region, the controller 204 may determine whether the detected relative humidity is within the shaded region at step 442.

If the controller 204 determines that the relative humidity is within the selected RH value band, steps 436–442 may be repeated to substantially enable the relative humidity to be maintained within, for instance, comfortable levels based upon the supply air temperature. If, however, the controller 204 determines that the relative humidity is outside of the selected RH value band, at step 444, the controller 204 may determine whether the relative humidity exceeds the maximum allowable relative humidity value ($RH_{MAX}$), which defines an upper limit of the RH value band.

If the controller 204 determines that the detected relative humidity exceeds the maximum allowable relative humidity value at step 444, the controller 204 may decrease the moisture content in the airflow supplied by the AC unit 114 by activating the dehumidifier 226 at step 446. On the other hand, if the controller 204 determines that the detected relative humidity falls below the minimum allowable relative humidity value, the controller 204 may increase the moisture content in the airflow supplied by the AC unit 114 by activating the humidifier 226 at step 448.

Following either of steps 446 and 448, steps 436–448 may be repeated to thus maintain relative humidity levels in the data center 100 within comfortable limits, while reducing the energy consumed in operating the AC unit 114. In addition, the operational mode 400 may continue indefinitely, or it may be discontinued, for instance, if the AC unit 114 is powered down, after a predefined period of time, after a predefined number of iterations, under an intermittent operational scheme, etc.

Figure 4C:
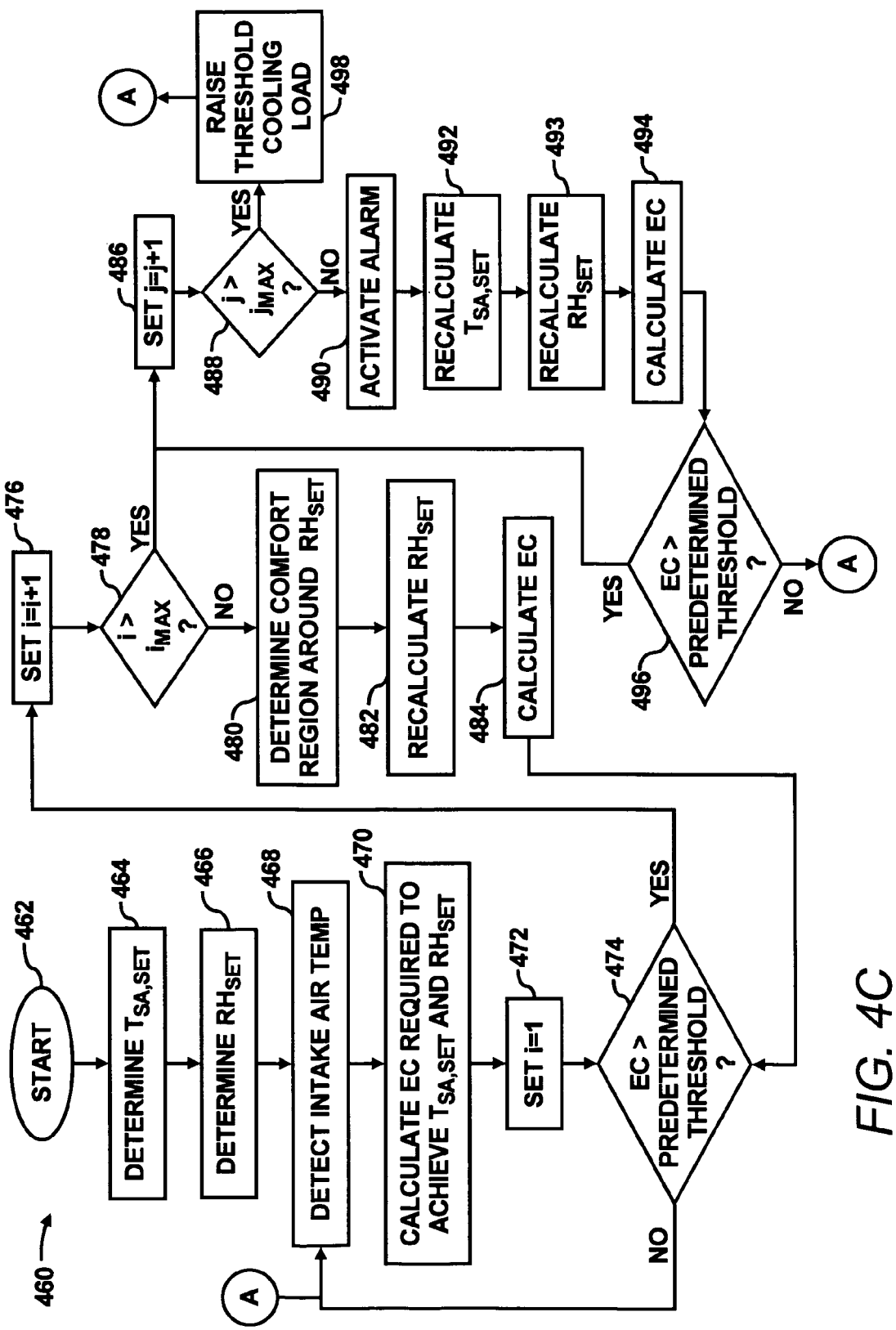
FIG. 4C illustrates a flow diagram of an operational mode for controlling an AC unit based on psychrometrics, according to a third example of an embodiment of the invention.

FIG. 4C illustrates a flow diagram of an operational mode 460 for controlling an AC unit 114 based on psychrometrics, according to a third example. It is to be understood that the following description of the operational mode 460 is but one manner of a variety of different manners in which an embodiment of the invention may be practiced. It should also be apparent to those of ordinary skill in the art that the operational mode 460 represents a generalized illustration and that other steps may be added or existing steps may be removed, modified or rearranged without departing from the scope of the operational mode 460.

The description of the operational mode 460 is made with reference to the block diagrams 200 and 250 illustrated in FIGS. 2A and 2B, respectively, and thus makes reference to the elements cited therein. It should, however, be understood that the operational mode 460 is not limited to the elements set forth in the block diagrams 200 and 250. Instead, it should be understood that the operational mode 460 may be practiced by an AC unit control system having a different configuration than those set forth in the block diagrams 200 and 250. In addition, although particular reference is made to a single AC unit 114, the operational mode 460 may be performed on a plurality of AC units 114 as, for instance, in a multi-AC unit data center 100.

The operational mode 460 may be employed to generally operate the AC unit 114 in manners to substantially ensure that the AC unit 114 is operating below a predetermined threshold cooling load. In the operational mode 460, as the intake air temperature changes due to variations in heat loads, the controller 204 may calculate the energy consumption required to achieve a desired supply air temperature set point and RH set point. In addition, the controller 204 may recalculate the RH set point to bring the energy consumption required to a level below an energy consumption level threshold. In this regard, the operational mode 460 may be employed to substantially reduce the energy consumed by the AC unit 114.

The operational mode 460 may be initiated in response to a variety of stimuli at step 462. For example, the operational mode 460 may be initiated in response to a predetermined lapse of time, in response to receipt of a transmitted signal, manually initiated, etc. At step 464, the controller 204 may determine and set a predetermined supply air temperature set point ($T_{SA,SET}$). The supply air temperature set point may be determined based upon the level of cooling required in the data center 100. In addition, the controller 204 may determine and set a predetermined RH set point ($RH_{SET}$) at step 466. The RH set point may be determined through a correlation between the supply air temperature set point and a desired specific humidity level. For instance, the initial RH set point may be based upon standard operating conditions known to be followed in data centers. By way of example, the initial RH set point may be set to approximately 50% RH, at 72° F., which corresponds to a specific humidity of 8 grams of moisture per kilogram of dry air).

At step 468, the temperature of the intake air of the AC unit 114 may be detected by, for instance, the temperature sensor 206a. The detected intake air temperature may also be communicated to the controller 204. The controller 204 may determine, based upon the detected intake air temperature, the amount of energy consumption (EC) will be required by the AC unit 114 to achieve the supply air temperature set point and the RH set point, at step 470. The controller 204 may also initiate or set a timer or counter at i=1 at step 472. At step 474, the controller 204 may determine whether the required energy consumption exceeds a predetermined threshold. The predetermined threshold may be set, for instance, to ensure that the amount of power utilized to operate the AC unit 114 is minimized while enabling sufficient cooling to be delivered to the data center 100. The predetermined threshold may thus be based upon factors, such as, loading, supply air temperature, relative humidity, etc. In one example, the predetermined threshold may be considered as the minimum amount of energy required to change the temperature of the supplied airflow without causing humidification or dehumidification.

If, at step 474, it is determined that the required energy consumption equals or falls below the predetermined threshold, the temperature of the intake air may be detected again at step 468. In addition, steps 470–474 may be repeated for any reasonably suitable number of iterations or period of time. For instance, steps 468–474 may be repeated so long as the AC unit 114 is operational, for a predetermined period of time, for a predetermined number of iterations, manually discontinued, etc.

If, on the other hand, at step 474, the required energy consumption exceeds the predetermined threshold, the controller 204 may set the timer or counter to i=i+1, at step 476. In addition, at step 478, the controller 204 may determine whether the number of iterations or amount of time denoted by "i" exceeds a predetermined maximum number of iterations or amount of time ($i_{MAX}$). The predetermined maximum number of iterations or amount of time may be based upon a variety of factors. For instance, the predetermined maximum may be user-defined. Alternatively, the predetermined maximum may be based upon criteria, such as, for instance, the number of RH levels contained in a comfort region associated with the supply air temperature set point.

If "i" falls below or equals the predetermined maximum, the comfort region around the RH set point may be determined, as indicated at step 480. In one example, the comfort region may be determined through testing to determine at which relative humidity levels desired comfort levels are achieved for various supply air temperatures. The comfort regions may be defined for all of the potential temperatures of the airflow supplied by the AC unit 114. The defined comfort regions may be programmed into the RH control module 218 and they may also be stored in the memory 214. In another example, the comfort regions may be defined as comprising a predetermined area around the RH set point. In addition, the comfort regions may be defined for any number of relative humidity levels, such that, given an RH set point, the associated comfort regions may relatively easily be determined.

Figure 5C:
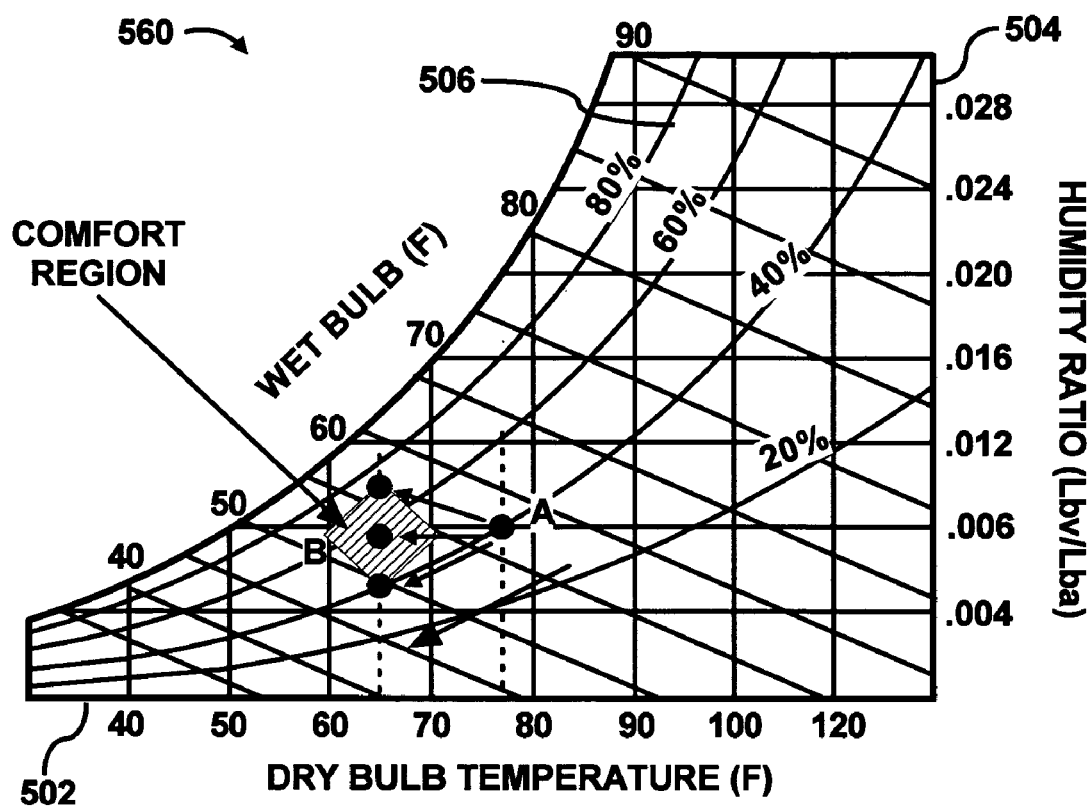

In any respect, at step 482, the controller 204 may recalculate the RH set point such that the new RH set point is within the predefined comfort region. The controller 204 may access a psychrometric chart stored, for instance, in the memory 214 to define the comfort regions and to set the new RH set point. The psychrometric chart may comprise data points similar to those in the psychrometric graph 560 depicted in FIG. 5C. The psychrometric graph 560 includes a dry bulb temperature axis 502, a humidity ratio axis 504 and wet bulb lines 506. With reference to the example illustrated in the psychrometric chart 560, the RH set point may be considered as the point nearest the 60% RH line. In addition, it may be seen that a shaded portion in the graph 560 depicts the comfort region associated with that RH set point. Thus, at step 482, the controller 204 may calculate the new RH set point within the comfort region by going along the same temperature line, in this case, 64° F. As shown, the lowermost point in "B" is within the comfort region; whereas, the uppermost point in "B" is outside of the comfort region. Thus, the controller 204 may change the RH set point to the lowermost point in "B" at step 482, which is around 40%.

The controller 204 may also calculate the energy consumption (EC) required to achieve the supply air temperature set point and the newly calculated RH set point at step 484. The required energy consumption may be calculated in manners as described hereinabove with respect to step 470. In addition, it may be determined whether the required energy consumption calculated at step 484 exceeds the predetermined threshold at step 474. If the required energy consumption falls below or equals the predetermined threshold at step 474, the intake air temperature may be detected at step 468 and steps 470–484 may be repeated. If the required energy consumption still exceeds the predetermined threshold, steps 476–484 may be repeated until either the required energy consumption falls below or equals the predetermined threshold or "i" exceeds the predetermined maximum for "i" at step 478.

If the value "i" exceeds the predetermined maximum at step 478, a timer or counter "j" may be set to j+1 at step 486. In addition, at step 488, the controller 204 may determine whether the number of iterations or amount of time denoted by "j" exceeds a predetermined maximum number of iterations or amount of time ($j_{MAX}$) The predetermined maximum number of iterations or amount of time may be based upon a variety of factors. For instance, the predetermined maximum may be user-defined. Alternatively, the predetermined maximum may be based upon criteria, such as, for instance, the number of RH levels contained in a comfort region associated with the supply air temperature set point.

If "j" falls below or equals the predetermined maximum, an alarm indicating that the required energy consumption exceeds the predetermined threshold may be activated at step 490. In addition, the supply air temperature set point may be recalculated in various manners to attempt to reduce the required energy consumption level at step 492. In one example, the supply air temperature may be set to equal a value determined through selection of a temperature value that enables operation of the AC unit 114 below the energy consumption predetermined threshold.

At step 493, the controller 204 may recalculate the RH set point such that the new RH set point is within the predefined comfort region as described hereinabove at step 482. In addition, at step 494, the energy consumption (EC) required to achieve the supply air temperature set point calculated at step 492 and the RH set point calculated at step 493 is calculated. The required energy consumption may be calculated in manners as described hereinabove with respect to step 470. In addition, it may be determined whether the required energy consumption calculated at step 494 exceeds the predetermined threshold at step 496. If the required energy consumption falls below or equals the predetermined threshold at step 496, the intake air temperature may be detected at step 468 and steps 470–496 may be repeated. If the required energy consumption still exceeds the predetermined threshold, steps 486–496 may be repeated until either the required energy consumption falls below or equals the predetermined threshold or "j" exceeds the predetermined maximum for "j" at step 488.

If the value "j" exceeds the predetermined maximum at step 488, the threshold cooling load may be raised at step 498. As an example, the threshold cooling load may be raised to achieve the temperature set point calculated at step 492. In addition, the intake air temperature may be detected at step 468 and the operational mode 400 may be repeated. The operational mode 400 may continue indefinitely, or it may be discontinued, for instance, if the AC unit 114 is powered down, after a predefined period of time, after a predefined number of iterations, under an intermittent operational scheme, etc.

The operations set forth in the operational modes 300, 400, 430, and 460 may be contained as utilities, programs, or subprograms, in any desired computer accessible medium. In addition, the operational modes 300, 400, 430, and 460 may be embodied by computer programs, which may exist in a variety of forms both active and inactive. For example, the computer programs may exist as software program(s) comprised of program instructions in source code, object code, executable code or other formats. Any of the above may be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 6:
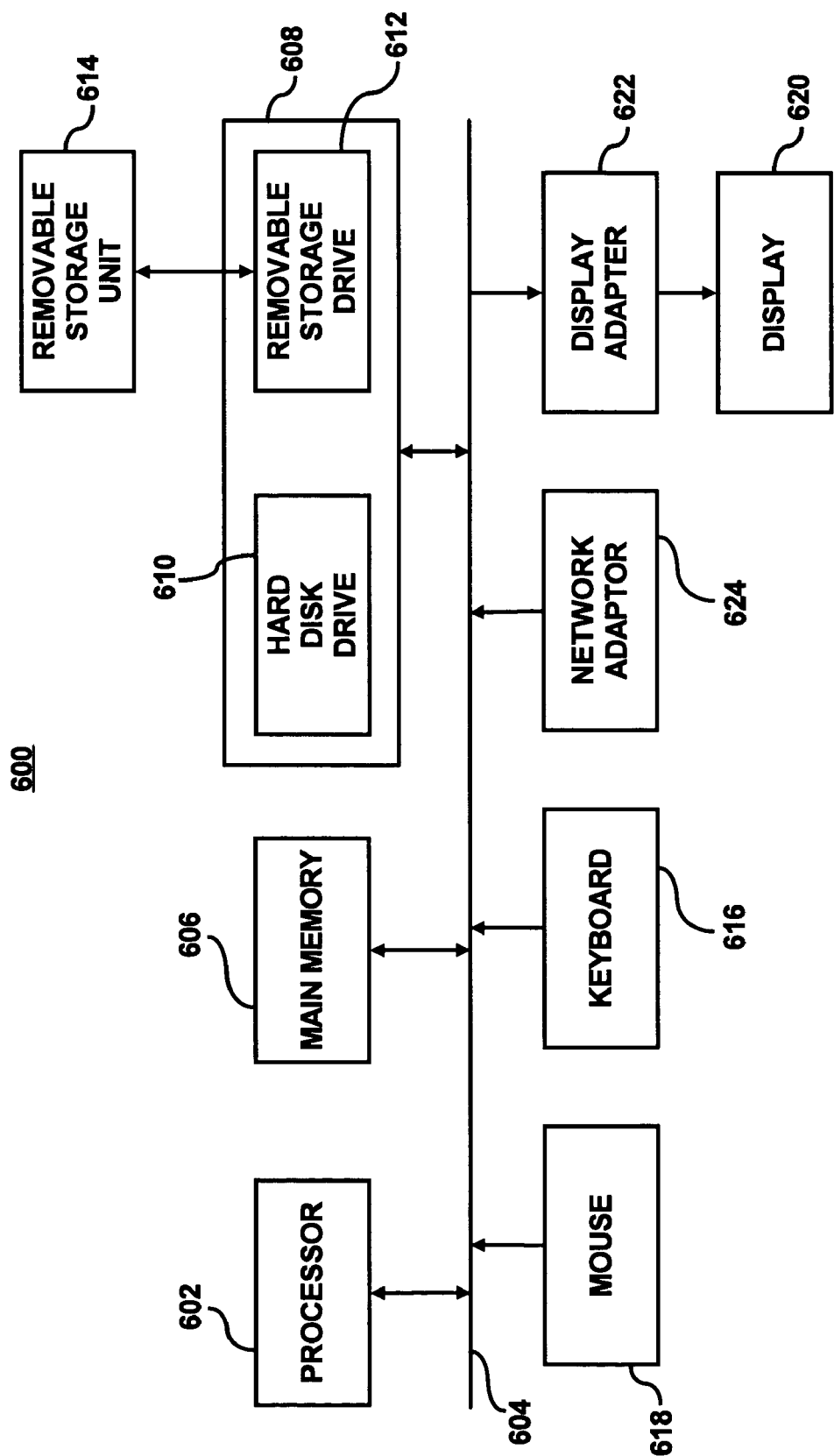
FIG. 6 illustrates an exemplary computer system, which may be used to implement various embodiments of the invention described herein.

FIG. 6 illustrates an exemplary computer system 600, which may be used to implement various examples described herein. The computer system 600 may include, for example, the computing device 128 and/or the controller 204. In this respect, the computer system 600 may be used as a platform for executing one or more of the functions described hereinabove with respect to the various components of the AC unit 114 control system 202, 252.

The computer system 600 includes one or more controllers, such as a processor 602. The processor 602 may be used to execute some or all of the steps described in the operational modes 300, 400, 430, and 460. Commands and data from the processor 602 are communicated over a communication bus 604. The computer system 600 also includes a main memory 606, such as a random access memory (RAM), where the program code for, for instance, the computing device 128 and/or the controller 204, may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for the provisioning system may be stored.

The removable storage drive 610 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor 602 may communicate over a network, for instance, the Internet, LAN, etc., through a network adaptor 624.

It will be apparent to one of ordinary skill in the art that other known electronic components may be added or substituted in the computer system 600. In addition, the computer system 600 may include a system board or blade used in a rack in a data center, a conventional "white box" server or computing device, etc. Also, one or more of the components in FIG. 6 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of operating an air conditioning unit to reduce moisture varying operations, said method comprising:

accessing psychrometric chart data;
   setting a specific humidity level for the air conditioning unit;
   detecting the temperature of air supplied by the air conditioning unit;
   determining a relative humidity act point based upon a relationship between the temperature of the air and the set specific humidity level from information contained in the psychrometric chart data, wherein the relative humidity set point comprises a threshold at which a humidification device of the air conditioning unit is activated; and
   varying the relative humidity set point of the air conditioning unit to maintain a substantially constant level of specific humidity at the set specific humidity level to thereby reduce moisture varying operations of the humidification device.

2. The method according to claim 1, further comprising:
   determining whether the relative humidity set point is outside of a predetermined range; and
   setting the relative humidity set point in response to the relative humidity set point being inside of the predetermined range to substantially prevent the air conditioning unit from varying moisture content.

3. The method according to claim 2, wherein the predetermined range comprises a maximum relative humidity set point and a minimum relative humidity set point, said method further comprising:
   decreasing the moisture content in the supplied air in response to the relative humidity set point exceeding the maximum relative humidity set point; and
   increasing the moisture content in the supplied air in response to the relative humidity set point falling below the minimum relative humidity set point.

4. The method according to claim 2, wherein the predetermined range is between around 20% to 80% relative humidity.

5. The method according to claim 1, wherein the predetermined range is defined according to safe operating conditions for electronic components positioned to be cooled by the air conditioning unit.

6. A method of operating an air conditioning unit to reduce moisture varying operations, said method comprising:

accessing psychrometric chart data;
   defining respective relative humidity value bands from the psychrometric chart data for a plurality of supply air temperatures based upon relative humidity ranges determined to provide suitable relative humidity levels for the respective plurality of supply air temperatures;
   detecting the temperature of air supplied by the air conditioning unit;
   selecting the relative humidity value band associated with the temperature of the air supplied;
   detecting the relative humidity of the air supplied;
   determining whether the detected relative humidity is within the selected relative humidity value band; and
   activating a humidification device of the air conditioning unit in response to the detected relative humidity falling outside of the selected relative humidity value band.

7. The method according to claim 6, further comprising:
   determining whether the detected relative humidity exceeds a predetermined maximum allowable relative humidity in response to the detected relative humidity falling outside of the selected relative humidity band; and
   wherein to predetermined maximum allowable relative humidity comprises an upper limit of the relative humidity band.

8. The method according to claim 7, wherein activating the humidification device further comprises:
  decreasing to moisture content in the supplied air in response to the detected relative humidity exceeding the predetermined maximum allowable relative humidity; and
  increasing the moisture content in the supplied air in response to the detected relative humidity falling below a predetermined minimum allowable relative humidity, wherein the predetermined minimum allowable relative humidity comprises a lower limit of the relative humidity value band.

9. A method of operating an air conditioning unit to reduce moisture varying operations, said method comprising:
  accessing psychrometric chart data;
  determining a supply air temperature set point;
  determining a relative humidity set point, said relative humidity set point comprising a threshold at which a humidification device of the air conditioning unit is activated;
  detecting the temperature of the intake air of the air conditioning unit;
  calculating the energy consumption required to achieve the supply air temperature set point and the relative humidity set point based upon the detected intake air temperature;
  determining whether the required energy consumption exceeds a predetermined threshold, said predetermined threshold comprising a minimum amount of energy required to change the temperature of airflow supplied by the air conditioning unit without causing the humidification device to activate; and
  determining a comfort region based upon the psychrometric chart data around the relative humidity set point in response to the required energy consumption exceeding the predetermined threshold.

10. The method according to claim 9, further comprising:
  determining whether a first number of iterations exceeds a first predetermined maximum number of iterations in response to the required energy consumption exceeding the predetermined threshold.
  wherein determining a comfort region further comprises determining a comfort region around the relative humidity set point from the psychrometric chart data in response to the first number of iterations falling below the first predetermined maximum number of iterations; and
  recalculating the relative humidity set point such that the recalculated relative humidity set point is within the comfort region.

11. The method according to claim 10, further comprising:
  recalculating the energy consumption required to achieve the recalculated relative humidity set point; and
  determining whether the recalculated required energy consumption exceeds the predetermined threshold.

12. The method according to claim 11, further comprising:
  determining whether a second number of iterations exceeds a second predetermined maximum number of iterations in response to the first number of iterations exceeding the first predetermined maximum number of iterations; and
  activating an alarm in response to the second number of iterations falling below the second predetermined maximum number of iterations.

13. The method according to claim 12, further comprising:
  raising a threshold cooling load of the air conditioning unit in response to the second number of iterations exceeding the second predetermined number of iterations.

14. The method according to claim 12, further comprising:
  recalculating the supply air temperature set point;
  recalculating the energy consumption required to achieve the recalculated supply air temperature set point; and
  determining whether the recalculated required energy consumption exceeds the predetermined threshold.

15. A system for operating an air conditioning unit, said system comprising:
  a temperature sensor configured to detect temperature around the air conditioning unit;
  a controller configured to control a humidification device for varying moisture content in the air supplied by to air conditioning unit;
  a memory accessible by the controller, said memory storing psychrometric chart data;
  wherein the controller is configured to define a specific humidity level for the air conditioning unit and to determine a relative humidity set point based upon a relationship between the temperature of the air and the predefined specific humidity level from information contained in the psychrometric chart data, wherein the relative humidity set point comprises a threshold at which the humidification device is activated; and
  wherein the controller is further configured to vary the relative humidity set point of the air conditioning device at the predefined specific humidity level to thereby reduce moisture varying operations of the humidification device.

16. The system according to claim 15, wherein the controller is further configured to vary the relative humidity set point to substantially prevent die humidification device from operating when the relative humidity set point is within a predetermined range comprised of a minimum relative humidity set point and a maximum relative humidity set point along the substantially constant level of the predefined specific humidity level.

17. The system according to claim 15, wherein the controller includes a supply air temperature control module and a relative humidity control module, wherein the relative humidity control module is configured to control the moisture varying device.

18. The system according to claim 15, wherein the controller comprises a computing device configured to control a plurality of air conditioning units.

19. A system for operating an air conditioning unit, said system comprising:
  a temperature sensor positioned to detect the temperature of air supplied by the air conditioning unit;
  a sensor for detecting relative humidity in the air supplied by the air conditioning unit;
  a controller configured to control a humidification device for varying moisture content in the air supplied by the air conditioning unit;
  a memory accessible by the controller, said memory storing psychrometric chart data;
  wherein the controller is configured to define relative humidity value bands from the psychrometric chart data for a plurality of supply air temperatures based upon relative humidity ranges determined to provide suitable relative humidity levels for the respective plurality of supply air temperatures and to select the relative humidity value band associated with the air supply temperature detected by the temperature sensor, and said controller being further configured to determine whether the detected relative humidity is within the selected humidity value band, and wherein the controller is configured to operate the moisture varying device bused upon the detected relative humidity falling outside of the selected relative humidity value band.

20. The system according to claim 19, wherein the controller is further configured to determine whether the detected relative humidity exceeds a predetermined maximum allowable relative humidity in response to the detected relative humidity falling outside of the selected relative humidity band, wherein the predetermined maximum allowable relative humidity comprises an upper limit of the relative humidity band.

21. The system according to claim 20, wherein the controller is further configured to decrease the moisture content in the supplied air in response to the detected relative humidity exceeding the predetermined maximum allowable relative humidity and to increase the moisture content in the supplied air in response to the detected relative humidity falling below a predetermined minimum allowable relative humidity, wherein the predetermined minimum allowable relative humidity comprises a lower limit of the relative humidity value band.

22. A system for operating an air conditioning unit, said system comprising:

a temperature sensor configured to detect temperature supplied into the air conditioning unit;

a controller configured to control a humidification device for varying moisture content in the air supplied by the air conditioning unit;

a memory accessible by the controller, said memory storing psychrometric chart data;

wherein the controller is configured to determine a supply air temperature set point and a relative humidity set point, said relative humidity set point comprising a threshold at which a humidification device of the air conditioning unit is activated;

wherein the controller is configured to calculate the energy consumption required to achieve the supply air temperature set point and the relative humidity set point based upon the detected intake air temperature, said controller being further configured to determine whether the required energy consumption exceeds a predetermined threshold, said predetermined threshold comprising a minimum amount of energy required to change the temperature of airflow supplied by the air conditioning unit without causing the humidification device to activate, and to determine a comfort region based upon the psychrometric chart data round the relative humidity set point in response to the required energy consumption exceeding the predetermined threshold.

23. The system according to claim 22, wherein the controller is further configured to recalculate the relative humidity set point such that the recalculated relative humidity set point is within the comfort region in response to the required energy consumption exceeding the predetermined threshold.

24. The system according to claim 23, wherein the controller is further configured to recalculate the energy consumption required to achieve the recalculated relative humidity set point, and to determine whether the recalculated required energy consumption exceeds the predetermined threshold.

25. The system according to claim 24, wherein the controller is configured to activate an alarm in response to the required energy consumption exceeding the predetermined threshold.

26. The system according to claim 25, wherein the controller is further configured to recalculate the supply air temperature set point, to recalculate the energy consumption required to achieve the recalculated supply air temperature, and to determine whether the recalculated energy consumption exceeds the predetermined threshold.

27. The system according to claim 26, wherein the controller is configured to raise a threshold cooling load of the air conditioning unit in response to the recalculated energy consumption exceeding the predetermined threshold.

28. A computer readable storage medium on which is embedded one or more computer programs, said one or more computer programs implementing a method of operating an air conditioning unit to substantially reduce moisture varying operations, said one or more computer programs comprising a set of instructions for:

accessing psychrometric chart data;

setting a specific humidity level for the air conditioning unit;

detecting the temperature of air supplied by the air conditioning unit;

determining a relative humidity set point based upon a relationship between the temperature of the air and the set specific humidity level from information contained in the psychrometric chart data, wherein the relative humidity set point comprises a threshold at which a humidification device of the air conditioning unit is activated; and varying the relative humidity set point of the air conditioning unit to maintain a substantially constant level of specific humidity at the set specific humidity level to thereby reduce moisture varying operations of the humidification device.

29. The computer readable storage medium according to claim 28, said one or more computer programs further comprising a set of instructions for:

decreasing the moisture content in the supplied air in response to the relative humidity set point exceeding a maximum relative humidity set point; and increasing the moisture content in the supplied air in response to the relative humidity set point falling below a minimum relative humidity set point.

* * * * *

UNITED STATES PATENT AND TRADEMARK OFFICE
CERTIFICATE OF CORRECTION

PATENT NO. : 7,155,318 B2  
APPLICATION NO. : 10/981487  
DATED : December 26, 2006  
INVENTOR(S) : Ratnesh K. Sharma et al.

It is certified that error appears in the above-identified patent and that said Letters Patent is hereby corrected as shown below:

In column 18, line 3, in Claim 1, delete "act" and insert -- set --, therefor.

In column 18, line 65, in Claim 7, delete "to" and insert -- the --, therefor.

In column 19, line 3, in Claim 8, delete "to" and insert --the --, therefor.

In column 19, line 42, in Claim 10, delete "threshold." and insert -- threshold; --, therefor.

In column 20, line 19, in Claim 15, delete "to" and insert -- the --, therefor.

In column 20, line 38, in Claim 16, delete "die" and insert -- the --, therefor.

In column 21, line 3, in Claim 19, delete "sensor," and insert -- sensor, --, therefor.

In column 21, line 9, in Claim 19, delete "bused" and insert -- based --, therefor.

In column 21, line 54, in Claim 22, delete "round" and insert -- around --, therefor.

Signed and Sealed this

Seventh Day of July, 2009

JOHN DOLL  
*Acting Director of the United States Patent and Trademark Office*